United States Patent
Tseng (10) Patent No.: US 6,271,072 B1
(45) Date of Patent: Aug. 7, 2001

(54) METHOD OF MANUFACTURING A STORAGE NODE HAVING FIVE POLYSILICON BARS

(75) Inventor: Horng-Huei Tseng, Hsinchu (TW)

(73) Assignee: Vanguard International Semiconductor Corporation, Hsin-Chu (TW)

(*) Notice: Subject to any disclaimer, the term of this patent is extended or adjusted under 35 U.S.C. 154(b) by 0 days.

(21) Appl. No.: 09/332,424

(22) Filed: Jun. 14, 1999

(51) Int. Cl.[7] .................................. H01L 21/8234
(52) U.S. Cl. ............................. 438/238; 438/396
(58) Field of Search .................... 438/238, 253, 438/255, 397

(56) References Cited

U.S. PATENT DOCUMENTS

| | | | |
|---|---|---|---|
| 5,362,606 | 11/1994 | Hartney et al. | 430/315 |
| 5,436,187 | 7/1995 | Tanigawa | 437/52 |
| 5,712,202 | 1/1998 | Liaw et al. | 438/253 |
| 5,721,154 | 2/1998 | Jeng | 437/60 |
| 5,733,808 | 3/1998 | Tseng | 438/239 |
| 5,753,419 | 5/1998 | Misium | 430/313 |
| 5,753,420 | 5/1998 | Misium | 430/313 |
| 5,821,139 | 10/1998 | Tseng | 438/239 |
| 5,849,617 | * 12/1998 | Wu | 438/253 |
| 5,953,608 | * 9/1999 | Hirota | 438/253 |
| 5,956,587 | * 9/1999 | Chen et al. | 438/255 |
| 6,080,621 | * 6/2000 | Wang et al. | 438/253 |
| 6,093,601 | * 7/2000 | Tsai et al. | 438/253 |
| 6,124,162 | * 9/2000 | Lin | 438/238 |

* cited by examiner

*Primary Examiner*—Olik Chaudhuri
*Assistant Examiner*—William David Coleman
(74) *Attorney, Agent, or Firm*—George O. Saile; Stephen B. Ackerman; Rosemary L. S. Pike (57) ABSTRACT

A method for forming a dynamic random access memory cell with an increased capacitance capacitor having a storage node with five polysilicon bars is achieved. A photoresist mask is formed overlying a portion of a first polysilicon layer filling an opening through a dielectric layer to a node contact region. The photoresist mask is silylated to form a top silylated photoresist portion and silylated photoresist sidewalls on the surfaces of the photoresist mask. The top silylated photoresist portion and the unsilylated mask are removed. A portion of the first polysilicon layer is etched away where it is not covered by the silylated photoresist sidewalls thereby forming two first polysilicon bars underlying the silylated photoresist sidewalls and leaving a second thickness of the first polysilicon layer smaller than its first thickness. The silylated photoresist sidewalls are removed. A second dielectric layer is deposited over the first polysilicon layer and is anisotropically etched back to form spacers on either side of the two polysilicon bars. A second polysilicon layer is deposited and the first and second polysilicon layers are anisotropically etched back to form three second polysilicon bars and a T-shaped first polysilicon layer. The dielectric spacers are removed whereby the T-shaped first polysilicon layer and the two first polysilicon bars and three second polysilicon bars make five polysilicon bars which together form a storage node of the capacitor.

21 Claims, 8 Drawing Sheets

METHOD OF MANUFACTURING A STORAGE NODE HAVING FIVE POLYSILICON BARS

BACKGROUND OF THE INVENTION (1) Field of the Invention

The present invention relates to a method of fabricating a dynamic random access memory, and more particularly, a method of fabricating a dynamic random access memory having a storage node with five polysilicon bars.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering of source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked cylindrical capacitor design in which the capacitor cell uses the space over the device area for the capacitor plates. In U.S. Pat. No. 5,436,187 to Tanigawa, a cylindrical capacitor is formed using spacers. U.S. Pat. No. 5,733,808 to Tseng forms a cylindrical capacitor by laterally etching a resist mask and then etching out the central portion of a polysilicon layer. U.S. Pat. No. 5,712,202 to Liaw et al shows a process for a double-walled cylindrical capacitor using spacers and an etch back process. U.S. Pat. No. 5,821,139 to Tseng and U.S. Pat. No. 5,721,154 to Jeng show processes for forming double-walled cylindrical capacitors using spacers. U.S. Pat. No. 5,753,420 to Misium teaches a process of silylating an unexposed photoresist layer leaving a residue to be used in etching a capacitor plate with peaks. U.S. Pat. No. 5,753,419 to Misium uses silylated photoresist to etch a wave pattern into a polysilicon layer to form a storage node. U.S. Pat. No. 5,362,606 to Hartney et al discloses the use of silylated photoresist to form a pattern.

SUMMARY OF THE INVENTION

Accordingly, it is a primary object of the invention to provide an improved and very manufacturable process for producing a memory cell capacitor with increased capacitance.

A further object of the invention is to provide a method for forming a capacitor having a storage node with five polysilicon bars.

Yet another object is to provide a method for forming a capacitor having a storage node with five polysilicon bars by using a silylated photoresist process.

According to the objects of the invention, a method is described for forming a dynamic random access memory cell with an increased capacitance capacitor having a storage node with five polysilicon bars by using a silylated photoresist process. Semiconductor device structures are provided in and on a semiconductor substrate wherein the semiconductor device structures include a node contact region within the semiconductor substrate. A first dielectric layer is deposited overlying the semiconductor device structures and planarized. A contact opening is made through the first dielectric layer to the node contact region. A first layer of polysilicon is deposited overlying the first dielectric layer and filling the contact opening. A photoresist mask is formed overlying the portion of the first polysilicon layer over the node contact region. The photoresist mask is silylated to form a top silylated photoresist portion and silylated photoresist sidewalls on the surfaces of the photoresist mask. The top silylated photoresist portion is removed. The unsilylated photoresist mask is removed. A portion of the first polysilicon layer is etched away where it is not covered by the silylated photoresist sidewalls thereby forming two first polysilicon bars underlying the silylated photoresist sidewalls and leaving a second thickness of the first polysilicon layer smaller than its first thickness. The silylated photoresist sidewalls are removed. A second dielectric layer is deposited overlying the first polysilicon layer and is etched back anisotropically to form inner spacers on the inner sides of the two first polysilicon bars and outer spacers on the outer sides of the two first polysilicon bars wherein there is a gap between the inner spacers. A second polysilicon layer is deposited overlying the first polysilicon layer, first polysilicon bars, and spacers. The first and second polysilicon layers are anisotropically etched back to form two second polysilicon bars on the outside edges of the outer spacers and a third second polysilicon bar filling the gap between the inner spacers and to form a T-shaped first polysilicon layer wherein the vertical portion of the T-shape lies within the node contact opening and wherein the horizontal portion of the T-shape overlies the vertical portion and underlies the two first polysilicon bars and the three second polysilicon bars. The dielectric spacers are removed whereby the T-shaped first polysilicon layer and the two first polysilicon bars and three second polysilicon bars make five polysilicon bars which together form a storage node of the capacitor. A capacitor dielectric layer is deposited over the first dielectric layer and the storage node. A third polysilicon layer is deposited overlying the capacitor dielectric layer wherein the third polysilicon layer forms the top electrode of the capacitor. The third polysilicon layer and the capacitor dielectric layer are patterned to complete formation of a DRAM with capacitor.

BRIEF DESCRIPTION OF THE DRAWINGS

In the following drawings forming a material part of this description, there is shown.

DESCRIPTION OF THE PREFERRED EMBODIMENTS

Now, in keeping with the objectives of this invention, the method for forming a DRAM storage capacitor having a multi-pillared storage node by using a silylated photoresist process is described in detail. The sequence of fabrication steps for the stacked capacitor of the invention is shown in FIGS. 1 through 15. The process for forming the field oxide and the field effect transistor structure as presently practiced in manufacturing DRAM cells is described only briefly in order to better understand the current invention. It should be well understood by those skilled in the art that by including additional process steps not described in this embodiment, other types of devices can be included on the DRAM chip. For example, P wells in the P substrate and CMOS circuits can be formed therefrom. It should also be understood that the figures depict only one DRAM storage cell out of a multitude of cells that are fabricated simultaneously on the substrate. Also, the capacitor of the invention can be used in other chip types in addition to DRAM chips.

Figure 1:
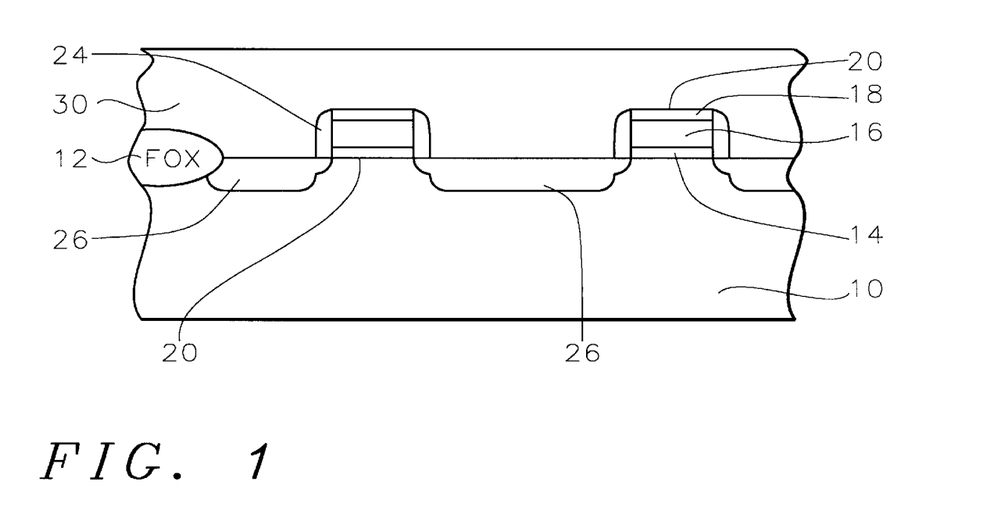
FIGS. 1 through 15 are schematic cross-sectional representations of a preferred embodiment of the present invention.

Referring now more particularly to FIG. 1, the first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, field oxide regions 12 are formed in and on the semiconductor substrate.

The surface of the silicon substrate 10 is thermally oxidized to form the desired gate oxide 14 thickness. The preferred thickness is between about 80 to 200 Angstroms. The polysilicon layer 16 is blanket deposited by low pressure chemical vapor deposition (LPCVD) to a preferred thickness of between about 1500 to 3500 Angstroms. A layer 18 of silicon oxide is chemically vapor deposited over the surface of the polysilicon to a thickness of between about 600 to 1200 Angstroms. The layers 14, 16, and 18 are patterned by lithography and anisotropic etching techniques as are conventional in the art to provide a desired pattern of gate electrodes and word lines 20 as seen in FIG. 1.

The source/drain structure of the MOS FET may now be formed by the following steps. FIGS. 1 through 12 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N− dopants. Lithographic masks may be required to protect the areas not to be subjected to that particular N− ion implantation. The formation of the lithographic masks is done by conventional lithography and etching techniques. The N− lightly doped drain implantation 22 is done with, for example, $P_{31}$ at a dosage of between about 1 E 13 to 1 E 14 atoms/cm$^2$ and an energy of between about 20 to 40 Kev.

The dielectric spacer 24 is now to be formed followed by the completion of the lightly doped drain source/drain structures. A tetraethoxysilane (TEOS) LPCVD deposition is preferred to a thickness of between about 1000 to 2000 Angstroms.

An anisotropic etching of this layer produces the dielectric spacer layer 24 on the sidewalls of the layer structures 20.

The heavily doped source and drain regions 26 are formed by implantation with, for example, arsenic at a dosage of between about 1 E 15 to 1 E 16 atoms/cm$^2$ and an energy of between about 20 to 80 Kev.

A first dielectric layer 30 is formed over the field oxide and device areas. This may be a layer of silicon oxide deposited to a thickness of between about 3000 to 15,000 Angstroms. The dielectric layer is planarized, for example by chemical mechanical polishing (CMP), to obtain a flat surface.

Figure 2:
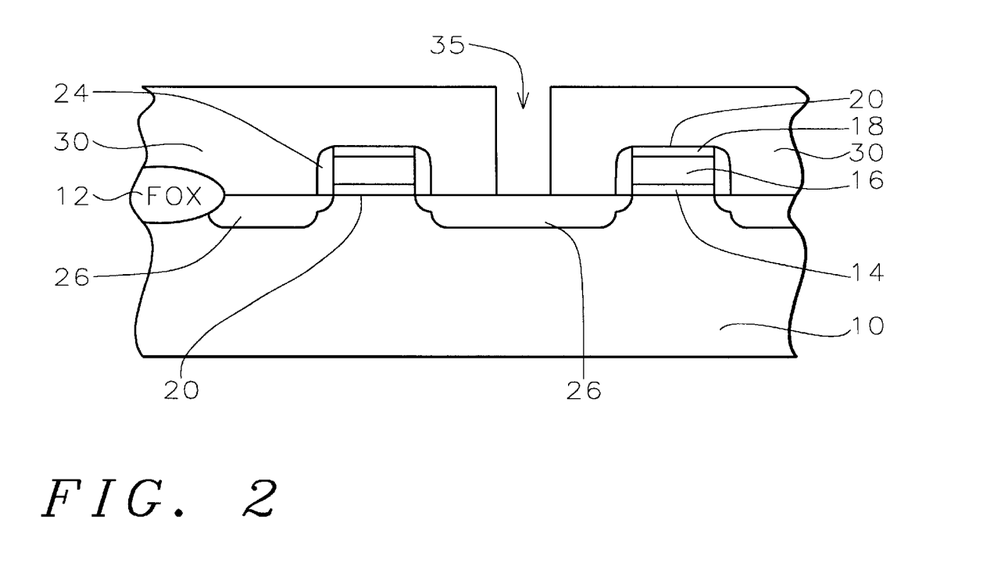

Referring now to FIG. 2, using conventional lithographic and etching techniques, a contact opening is made through the dielectric layer 30 to a conductor region in the silicon substrate, for example, source region 26. Opening 35 is made to the node contact region for the capacitor structure.

Figure 3:
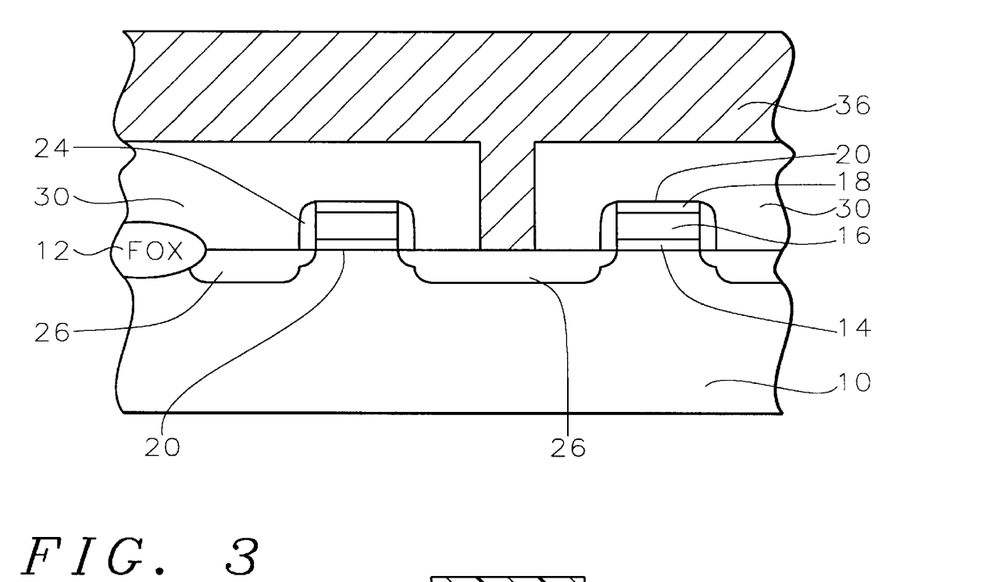

Referring now to FIG. 3, a first polysilicon layer 36 is deposited over dielectric layer 30 by LPCVD, preferably in situ doped. The thickness of this layer is between about 500 to 1000 Angstroms. The polysilicon layer 36 fills the contact hole and makes electrical contact with the node contact region 26.

Figure 4:
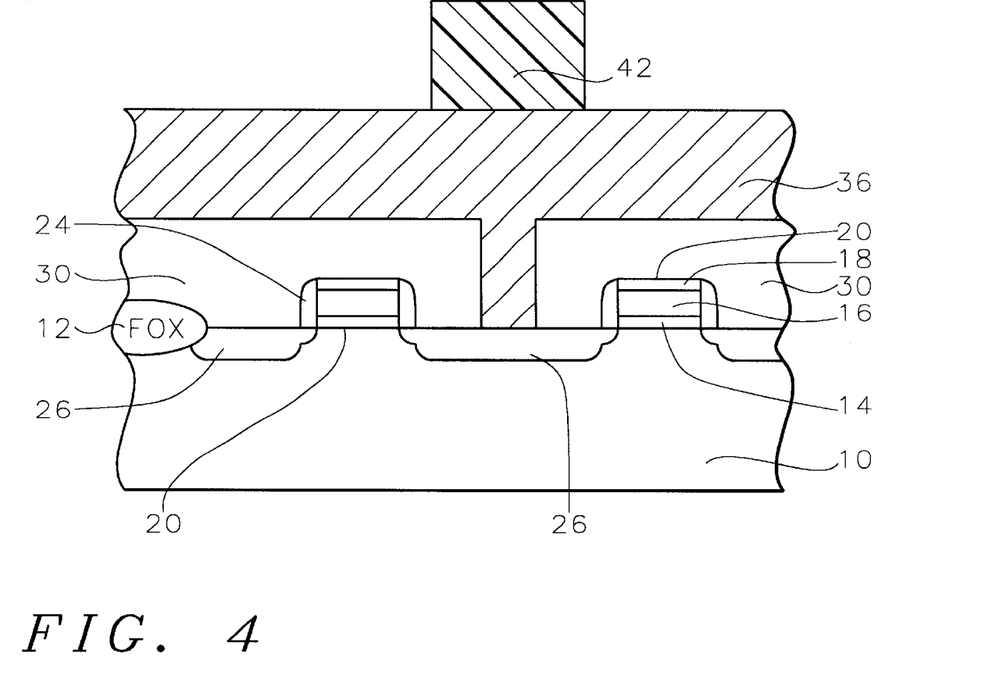

Referring now to FIG. 4, a photoresist layer is coated over the polysilicon layer 36 to a thickness of between about 2000 and 15,000 Angstroms and patterned to form the photoresist mask 42 over a portion of the first polysilicon layer including that portion overlying the node contact.

Figure 5:
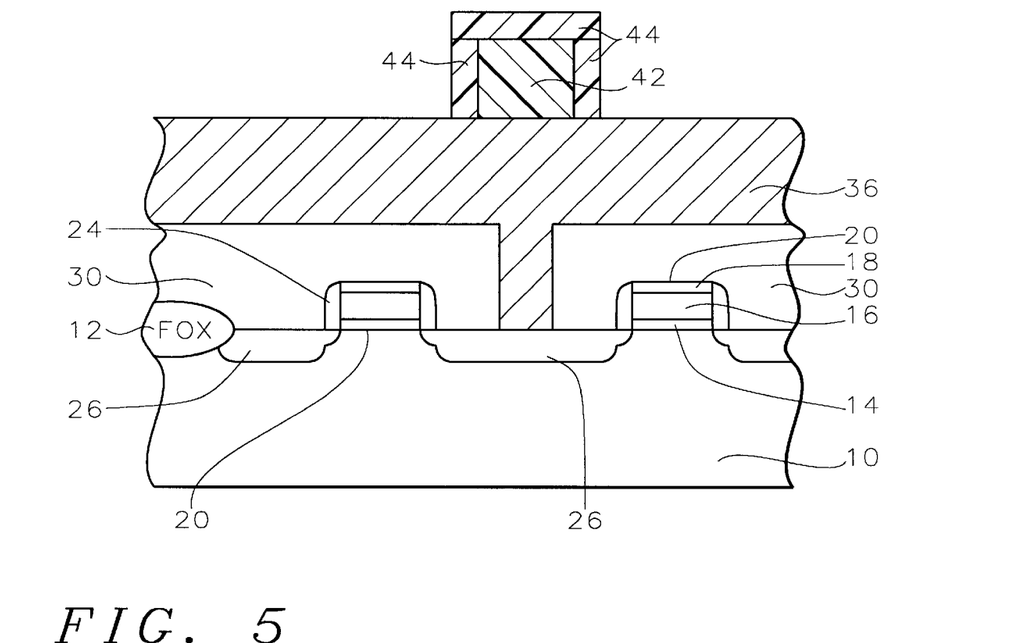

Referring now to FIG. 5, the photoresist mask 42 is silylated. Silylation is the diffusion of silicon into the photoresist material. During silylation, the photoresist is heated in an atmosphere containing a silylation agent. The photoresist is heated to a temperature of between about 50 and 70° C. for 2 to 8 minutes. Typical silylation agents include dimethylsilyldimethylamine (DMSDMA), dimethylsilyldiethylamine (DMSDEA), dimethylaminopentamethyldisilane (DMDS), and N,N-dimethylamino-1, 2dimethyldisilane (DMDS). The hydrogen radicals in the photoresist mask 42 are displaced by silicon atoms in the silylating agent to form silylated layer 44. The silylated layer 44 contains silicon and oxygen. This silylation process is cheaper and simpler than oxide sidewall technology.

Figure 6:
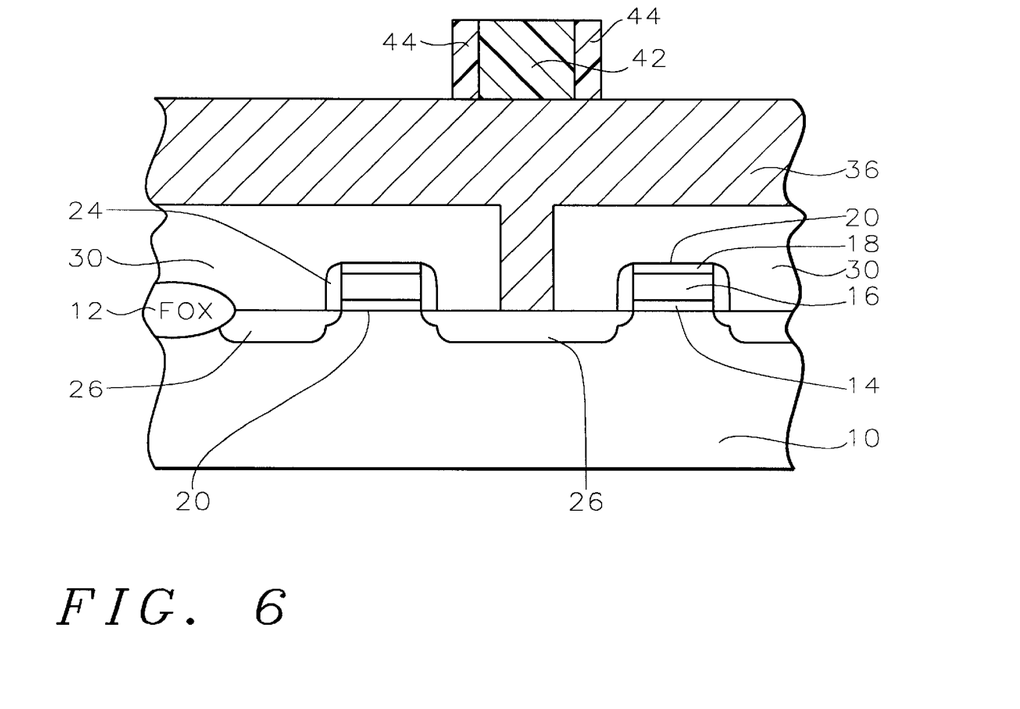

Referring now to FIG. 6, the top surface of the silylated photoresist is removed using an anisotropic plasma dry etch or a sputtering process. For example, a chlorine plasma may be used. The operative range of removal is between about 100 and 1000 Angstroms, but preferably 500 to 1000 Angstroms are removed to assure that all of the silylated photoresist 44 on the top surface of the photoresist 42 is removed. Sidewall silylated photoresist 44 remains.

Figure 7:
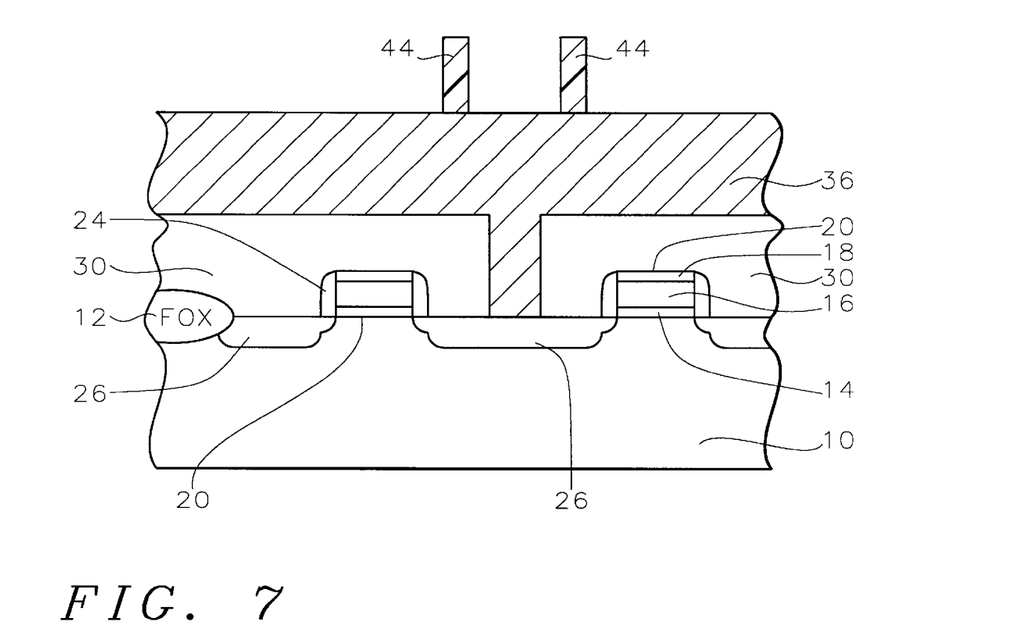

As shown in FIG. 7, the photoresist layer 42 is removed using oxygen plasma. The silylated photoresist sidewalls 44 are not removed by this process.

Figure 8:
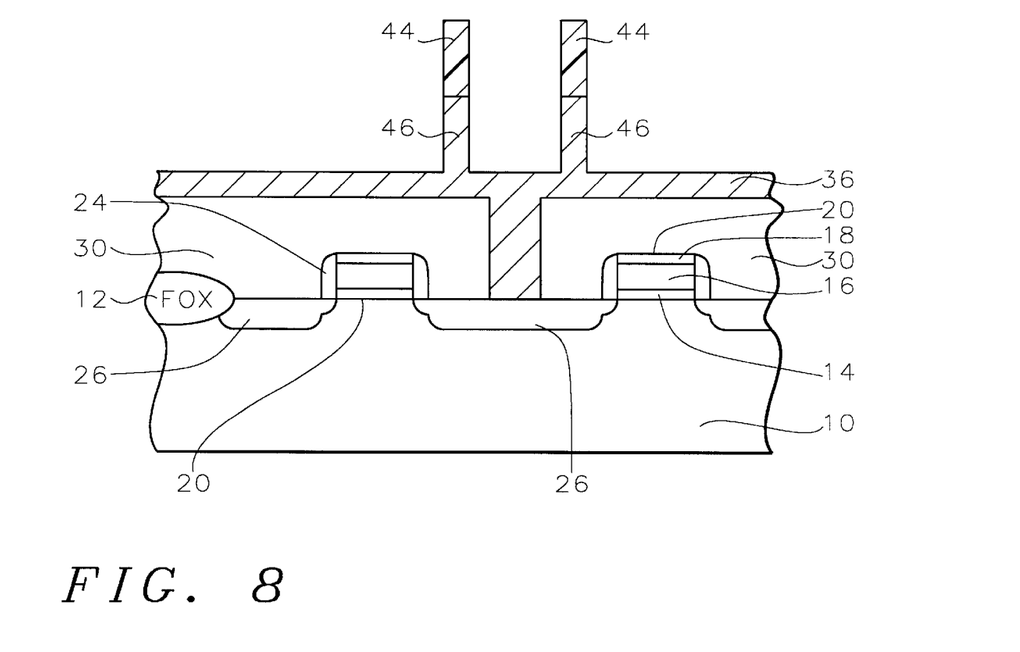

Next, portions of the first polysilicon layer 36 are removed where it is not covered by the silylated photoresist mask 44, using a dry plasma etch, such as chlorine/bromine plasma, or the like. Less oxygen should be used than in a conventional polysilicon etch to obtain a high etch selectivity of the silylated photoresist 44 with respect to the polysilicon 36. The plasma etch is conventional otherwise, for example reaction ion etch (RIE), magnetic enhanced reactive ion plasma etch (MERIE), or electron cyclotron resonance (ECR) etch. Two first polysilicon bars 46 are formed underneath the silylated photoresist sidewalls 44, as shown in FIG. 8. The thickness of the polysilicon layer 36 remaining overlying the dielectric layer 30 is between about 500 and 3000 Angstroms.

Figure 9:
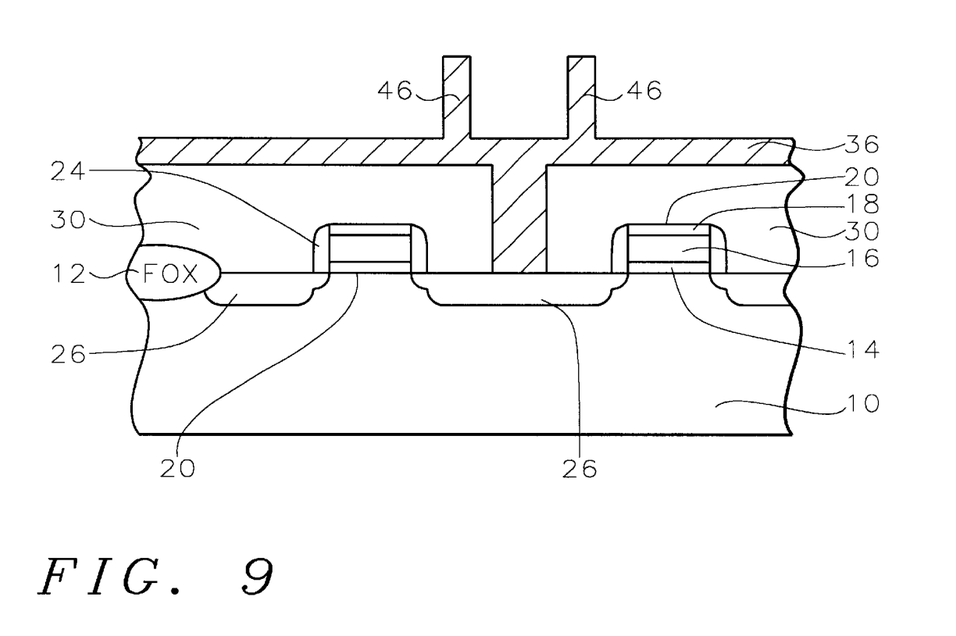

Referring now to FIG. 9, the sidewall silylated photoresist mask 44 is removed by conventional means.

Figure 10:
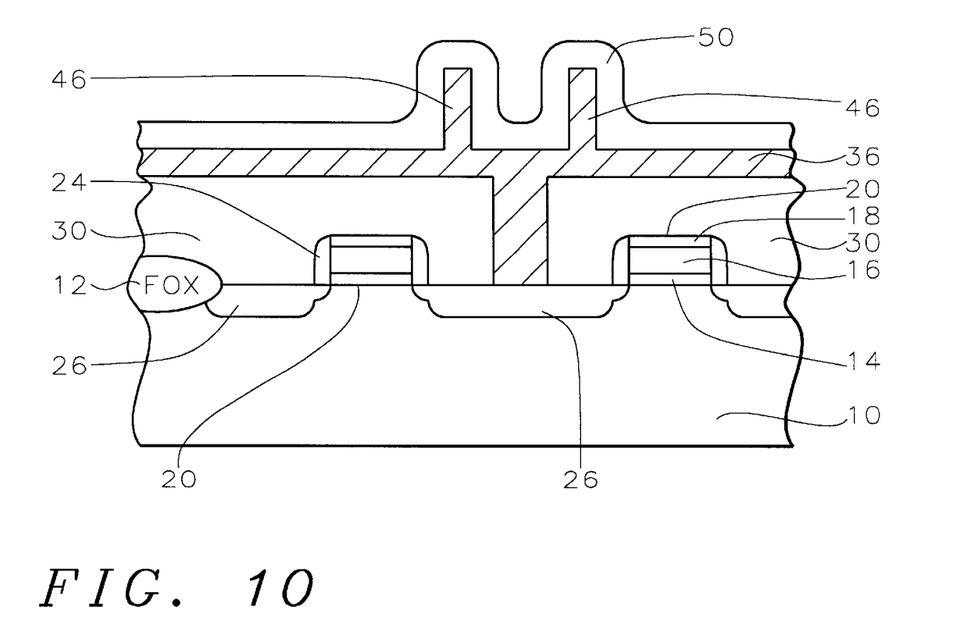

Referring to FIG. 10, a second dielectric layer 50 is deposited conformally over the first polysilicon layer 36 and first polysilicon bars 46. This layer comprises, for example, silicon oxide, silicon nitride, or a combination of the two and is deposited to a thickness of between about 300 and 3000 Angstroms.

Figure 11:
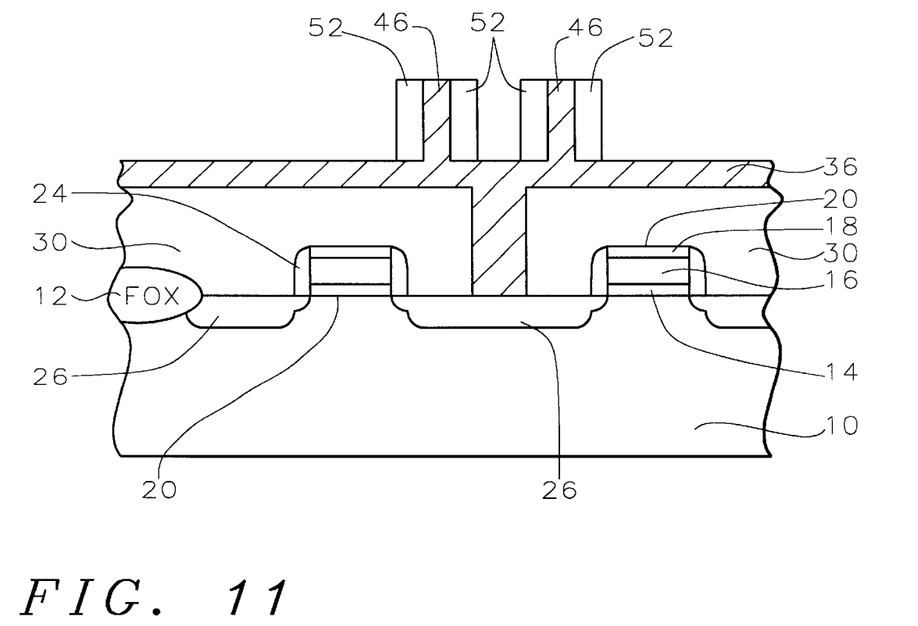

The second dielectric layer 50 is anisotropically etched back using a plasma etch to form spacers 52 on either side of the two first polysilicon bars 46, as illustrated in FIG. 11. There is a gap between the innermost two spacers.

Figure 12:
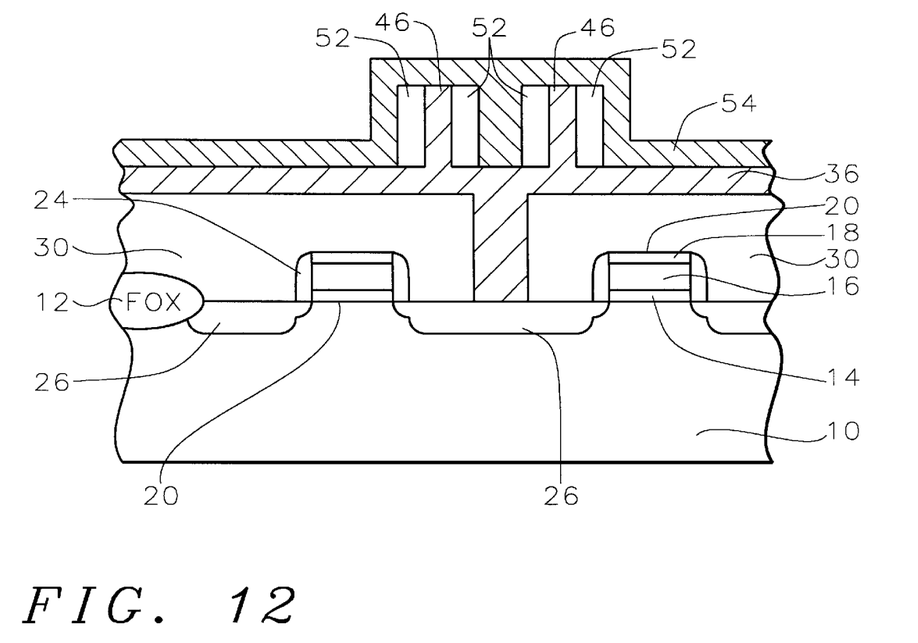

Now, referring to FIG. 12, a second layer of polysilicon 54 is deposited by LPCVD over the first polysilicon layer 36 and the dielectric spacers 52 and filling the gap between the innermost two spacers.

Figure 13:
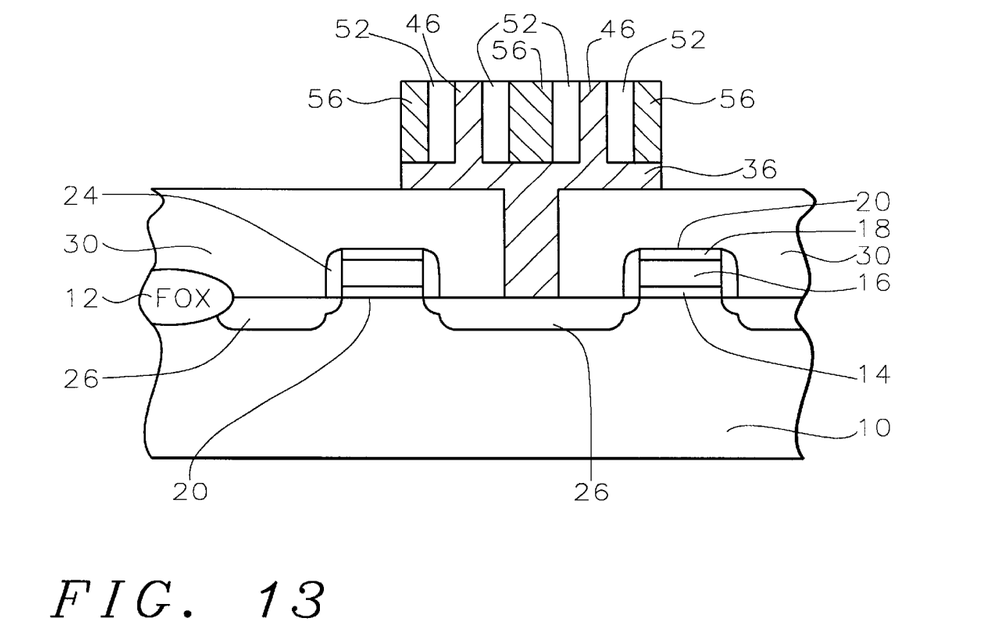

The first and second polysilicon layers are anisotropically etched back using a plasma etch to form three second polysilicon bars 56. Two of these bars are on the outsides of the outermost dielectric spacers 52 and the third bar fills the gap between the two innermost dielectric spacers. The resulting structure is shown in FIG. 13. The first polysilicon layer 36 has a T-shape in which the vertical portion of the T is within the node contact opening and the horizontal portion of the T overlies the vertical portion and underlies the five polysilicon bars 46 and 56.

Figure 14:
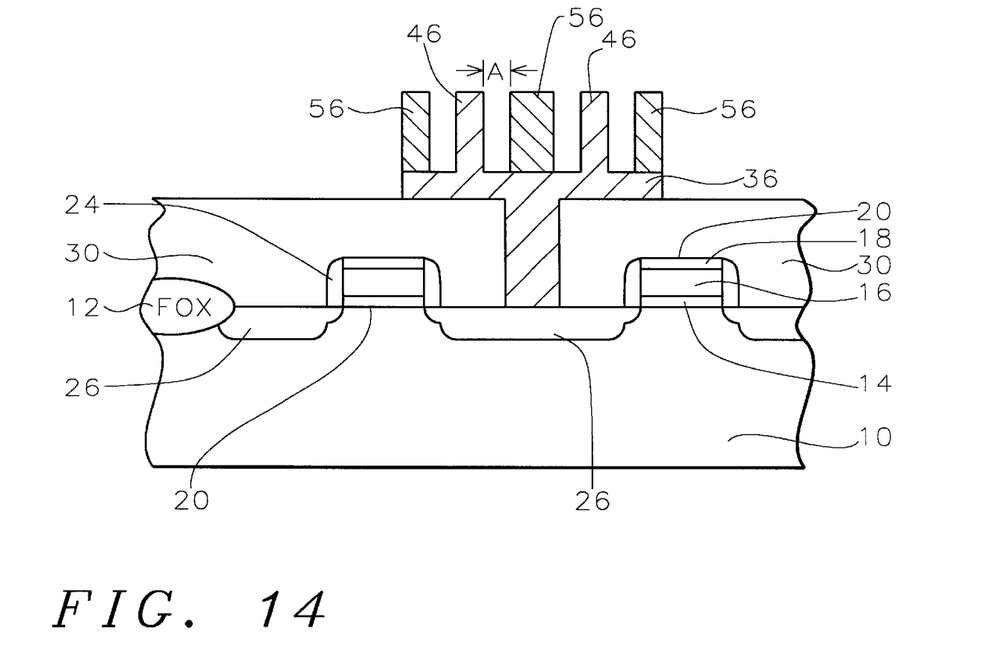

Next, as shown in FIG. 14, the dielectric spacers 52 are removed, using a solution of hydrofluoric acid (HF) or vapor HF. This completes formation of the storage node having five polysilicon bars. The T-shaped first polysilicon 36 and the vertically protruding two first polysilicon bars 46 and three second polysilicon bars 56 comprise the storage node of the stacked capacitor. Now the capacitor structure is to be completed.

Figure 15:
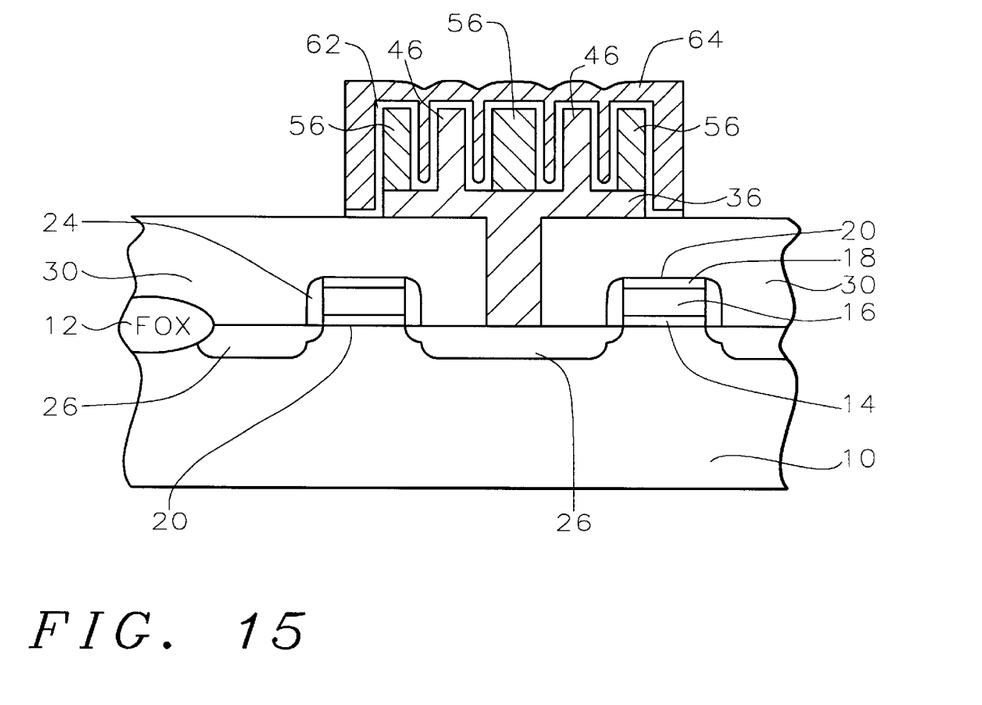

Referring now to FIG. 15, the capacitor dielectric layer 62 is deposited conformally over the polysilicon 36, 46, and 56 and insulating layer 30 surfaces. Conventional capacitor dielectrics such as NO (oxide/nitride), ONO (oxide/nitride/oxide) or tantalum oxide, or the like, may be used.

The top plate electrode is formed by depositing conformally a third in-situ doped polysilicon layer 64 by LPCVD. The thickness of this layer 64 is between about 300 to 3000 Angstroms. The third polysilicon layer 64 and capacitor dielectric 62 are patterned to form the top plate electrode of the capacitor.

The process of the invention results in an increased capacitance DRAM capacitor having a storage node with five polysilicon bars.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:

providing semiconductor device structures in and on a semiconductor substrate wherein said semiconductor device structures include a node contact region within said semiconductor substrate;

depositing a first dielectric layer overlying said semiconductor device structures and planarizing said first dielectric layer;

opening a contact through said first dielectric layer to said node contact region;

depositing a first layer of polysilicon overlying said first dielectric layer and filling said contact opening wherein said first polysilicon layer has a first thickness overlying said first dielectric layer;

forming a photoresist mask overlying the portion of said first polysilicon layer over said node contact region;

silylating said photoresist mask to form a top silylated photoresist portion and silylated photoresist sidewalls on the surfaces of said photoresist mask;

removing said top silylated photoresist portion;

removing said photoresist mask whereby said silylated photoresist sidewalls remain;

etching away a portion of said first polysilicon layer where it is not covered by said silylated photoresist sidewalls thereby forming two first polysilicon bars underlying said silylated photoresist sidewalls and leaving a second thickness of said first polysilicon layer overlying said first dielectric layer smaller than said first thickness;

removing said silylated photoresist sidewalls;

depositing a second dielectric layer overlying said first polysilicon layer;

anisotropically etching back said second dielectric layer to form inner spacers on the inner sides of said two first polysilicon bars and outer spacers on the outer sides of said two first polysilicon bars wherein there is a gap between said inner spacers;

depositing a second polysilicon layer overlying said first polysilicon layer, said first polysilicon bars, and said spacers;

anisotropically etching back said first and second polysilicon layers to form two second polysilicon bars on the outside edges of said outer spacers and a third second polysilicon bar filling said gap between said inner spacers whereby three second polysilicon bars are formed and to form a T-shaped first polysilicon layer wherein the vertical portion of said T-shape lies within said node contact opening and wherein the horizontal portion of said T-shape overlies said vertical portion and underlies said two first polysilicon bars and said three second polysilicon bars;

removing said dielectric spacers whereby said T-shaped first polysilicon layer and said two first polysilicon bars and said three second polysilicon bars make five polysilicon bars which together form a storage node of said capacitor;

depositing a capacitor dielectric layer over said first dielectric layer and said storage node;

depositing a third polysilicon layer overlying said capacitor dielectric layer wherein said third polysilicon layer forms the top electrode of said capacitor; and patterning said third polysilicon layer and said capacitor dielectric layer to complete formation of said DRAM with capacitor.

2. The method according to claim 1 wherein said first dielectric layer comprises silicon oxide having a thickness of between about 300 and 15,000 Angstroms.

3. The method according to claim 1 wherein said first dielectric layer is planarized by chemical mechanical polishing.

4. The method according to claim 1 wherein said polysilicon first thickness is between about 500 and 10,000 Angstroms.

5. The method according to claim 1 wherein said photoresist mask has a thickness of between about 2000 and 15,000 Angstroms.

6. The method according to claim 1 wherein said step of silylating said photoresist mask comprises heating said photoresist mask to a temperature of between about 50 and 70° C. for 2 to 8 minutes in an atmosphere containing a silylating agent.

7. The method according to claim 1 wherein said step of removing said top silylated photoresist portion comprises a plasma etching to a depth of between about 100 and 1000 Angstroms.

8. The method according to claim 1 wherein said step of removing said top silylated photoresist portion comprises a sputter etching to a depth of between about 100 and 1000 Angstroms.

9. The method according to claim 1 wherein said polysilicon second thickness is between about 500 and 3000 Angstroms.

10. The method according to claim 1 wherein said second dielectric layer comprises silcon oxide and has a thickness of between about 300 and 3000 Angstroms.

11. The method according to claim 1 wherein said second dielectric layer comprises silcon nitride and has a thickness of between about 300 and 3000 Angstroms.

12. The method according to claim 1 wherein said second polysilicon layer has a thickness of between about 500 and 10,000 Angstroms.

13. The method according to claim 1 wherein said third polysilicon layer has a thickness of between about 300 and 3000 Angstroms.

14. A method for fabricating a dynamic random access memory (DRAM) having a capacitor comprising:

proving semiconductor device structures in and on a semiconductor substrate wherein said semiconductor device structures include a node contact region within said semiconductor substrate;

depositing a first dielectric layer overlying said semiconductor device structures and planarizing said first dielectric layer;

opening a contact through said first dielectric layer to said node contact region;

depositing a first layer of polysilicon overlying said first dielectric layer and filling said contact opening wherein said first polysilicon layer has a first thickness overlying said first dielectric layer;

forming a photoresist mask overlying the portion of said first polysilicon layer over said node contact region;

silylating said photoresist mask to form a top silylated photoresist portion and silylated photoresist sidewalls on the surfaces of said photoresist mask;

removing said top silylated photoresist portion;

removing said photoresist mask whereby said silylated photoresist sidewalls remain;

etching away a portion of said first polysilicon layer where it is not covered by said silylated photoresist sidewalls using an etching recipe having a high etch selectivity of said silylated photoresist with respect to said polysilicon thereby forming two first polysilicon bars underlying said silylated photoresist sidewalls and leaving a second thickness of said first polysilicon layer overlying said first dielectric layer smaller than said first thickness;

removing said silylated photoresist sidewalls;

depositing a second dielectric layer overlying said first polysilicon layer;

anisotropically etching back said second dielectric layer to form inner spacers on the inner sides of said two first polysilicon bars and outer spacers on the outer sides of said two first polysilicon bars wherein there is a gap between said inner spacers;

depositing a second polysilicon layer overlying said first polysilicon layer, said first polysilicon bars, and said spacers;

anisotropically etching back said first and second polysilicon layers to form two second polysilicon bars on the outside edges of said outer spacers and a third second polysilicon bar filling said gap between said inner spacers whereby three second polysilicon bars are formed and to form a T-shaped first polysilicon layer wherein the vertical portion of said T-shape lies within said node contact opening and wherein the horizontal portion of said T-shape overlies said vertical portion and underlies said two first polysilicon bars and said three second polysilicon bars;

removing said dielectric spacers whereby said T-shaped first polysilicon layer and said two first polysilicon bars and said three second polysilicon bars make five polysilicon bars which together form a storage node of said capacitor;

depositing a capacitor dielectric layer over said first dielectric layer and said storage node;

depositing a third polysilicon layer overlying said capacitor dielectric layer wherein said third polysilicon layer forms the top electrode of said capacitor; and patterning said third polysilicon layer and said capacitor dielectric layer to complete formation of said DRAM with capacitor.

15. The method according to claim 14 wherein said first dielectric layer comprises silicon oxide having a thickness of between about 300 and 15,000 Angstroms.

16. The method according to claim 14 wherein said polysilicon first thickness is between about 500 and 10,000 Angstroms.

17. The method according to claim 14 wherein said photoresist mask has a thickness of between about 2000 and 15,000 Angstroms.

18. The method according to claim 14 wherein said step of silylating said photoresist mask comprises heating said photoresist mask to a temperature of between about 50 and 70° C. for 2 to 8 minutes in an atmosphere containing a silylating agent.

19. The method according to claim 14 wherein said step of removing said top silylated photoresist portion comprises a plasma etching to a depth of between about 100 and 1000 Angstroms.

20. The method according to claim 14 wherein said step of removing said top silylated photoresist portion comprises a sputter etching to a depth of between about 100 and 1000 Angstroms.

21. The method according to claim 14 wherein said polysilicon second thickness is between about 500 and 3000 Angstroms.

* * * * *